(12) United States Patent
Bakker

(10) Patent No.: US 7,439,818 B2
(45) Date of Patent: Oct. 21, 2008

(54) VOLTAGE-AND TEMPERATURE-COMPENSATED RC OSCILLATOR CIRCUIT

(75) Inventor: Gregory Bakker, San Jose, CA (US)

(73) Assignee: Actel Corporation, Mountain View, CA (US)

( * ) Notice: Subject to any disclaimer, the term of this patent is extended or adjusted under 35 U.S.C. 154(b) by 0 days.

(21) Appl. No.: 11/467,475

(22) Filed: Aug. 25, 2006

(65) Prior Publication Data

US 2006/0284666 A1    Dec. 21, 2006

Related U.S. Application Data

(63) Continuation of application No. 11/022,331, filed on Dec. 21, 2004, now Pat. No. 7,116,181.

(51) Int. Cl.
*H03K 3/26* (2006.01)
*H03K 3/02* (2006.01)
*H03K 3/42* (2006.01)
*H03L 1/00* (2006.01)

(52) U.S. Cl. .................. 331/111; 331/66; 331/143; 331/176; 327/513

(58) Field of Classification Search .......... 331/111, 331/113 R, 143, 144, 66, 176; 327/512, 327/513
See application file for complete search history.

(56) References Cited

U.S. PATENT DOCUMENTS

| | | | |
|---|---|---|---|
| 4,503,494 A | 3/1985 | Hamilton et al. | |
| 4,513,258 A | 4/1985 | Jamiolkowski et al. | |
| 4,758,745 A | 7/1988 | Elgamal et al. | |
| 4,855,954 A | 8/1989 | Turner et al. | |
| 4,870,302 A | 9/1989 | Freeman | |
| 4,879,688 A | 11/1989 | Turner et al. | |
| 5,101,122 A | 3/1992 | Shinonara | |
| 5,132,571 A | 7/1992 | McCollum et al. | |
| 5,237,218 A | 8/1993 | Josephson et al. | |
| 5,237,699 A | 8/1993 | Little et al. | |
| 5,336,951 A | 8/1994 | Josephson et al. | |
| 5,451,912 A | 9/1995 | Torode | |
| 5,559,449 A | 9/1996 | Padoan et al. | |
| 5,563,526 A | 10/1996 | Hastings et al. | |
| 5,638,418 A | 6/1997 | Douglass et al. | |
| 5,684,434 A | 11/1997 | Mann et al. | |
| 5,687,325 A | 11/1997 | Chang | |
| 5,811,987 A | 9/1998 | Ashmore, Jr. et al. | |

(Continued)

*Primary Examiner*—Robert J. Pascal
*Assistant Examiner*—James E Goodley
(74) *Attorney, Agent, or Firm*—Lewis and Roca LLP

(57) ABSTRACT

An integrated temperature-compensated RC oscillator circuit includes an inverter having an input and an output. An RC network is coupled between the inverter and a pair of comparators. A first comparator has an inverting input coupled to a first reference voltage, a non-inverting input coupled to the RC network, and an output. A second comparator has an inverting input coupled to the RC network, a non-inverting input coupled to a second reference voltage, and an output. A set-reset flip-flop has a set input coupled to the output of the first comparator, a reset input coupled to the output of the second comparator, and an output coupled to the input of the inverter. Differential amplifiers in the comparators each have a diode-connected p-channel MOS transistor controlling a mirrored p-channel MOS transistor whose channel width is less than that of the diode-connected p-channel current mirror transistor.

9 Claims, 4 Drawing Sheets

U.S. PATENT DOCUMENTS

| | | | |
|---|---|---|---|
| 5,821,776 A | 10/1998 | McGowan | |
| 5,877,656 A | 3/1999 | Mann et al. | |
| 5,889,701 A | 3/1999 | Kang et al. | |
| 5,949,987 A | 9/1999 | Curd et al. | |
| 5,999,014 A | 12/1999 | Jacobson et al. | |
| 6,034,541 A | 3/2000 | Kopec, Jr. et al. | |
| 6,091,641 A | 7/2000 | Zink | |
| 6,104,257 A | 8/2000 | Mann | |
| 6,134,707 A | 10/2000 | Herrmann et al. | |
| 6,145,020 A | 11/2000 | Barnett | |
| 6,150,837 A | 11/2000 | Beal et al. | |
| 6,191,660 B1 | 2/2001 | Mar et al. | |
| 6,243,842 B1 | 6/2001 | Slezak et al. | |
| 6,260,087 B1 | 7/2001 | Chang | |
| 6,272,646 B1 | 8/2001 | Rangasayee et al. | |
| 6,304,099 B1 | 10/2001 | Tang et al. | |
| 6,334,208 B1 | 12/2001 | Erickson | |
| 6,346,905 B1 | 2/2002 | Ottini et al. | |
| 6,356,107 B1 | 3/2002 | Tang et al. | |
| 6,389,321 B2 | 5/2002 | Tang et al. | |
| 6,396,168 B2 | 5/2002 | Ghezzi et al. | |
| 6,408,432 B1 | 6/2002 | Herrmann et al. | |
| 6,414,368 B1 | 7/2002 | May et al. | |
| 6,415,344 B1 | 7/2002 | Jones et al. | |
| 6,433,645 B1 | 8/2002 | Mann et al. | |
| 6,442,068 B1 | 8/2002 | Bartoli et al. | |
| 6,483,344 B2 | 11/2002 | Gupta | |
| 6,490,714 B1 | 12/2002 | Kurniawan et al. | |
| 6,515,551 B1 | 2/2003 | Mar et al. | |
| 6,526,557 B1 | 2/2003 | Young et al. | |
| 6,552,935 B2 | 4/2003 | Fasoli | |
| 6,594,192 B1 | 7/2003 | McClure | |
| 6,600,355 B1 | 7/2003 | Nguyen | |
| 6,614,320 B1 | 9/2003 | Sullam et al. | |
| 6,651,199 B1 | 11/2003 | Shokouhi | |
| 6,674,332 B1 | 1/2004 | Wunner et al. | |
| 6,748,577 B2 | 6/2004 | Bal | |
| 6,753,739 B1 | 6/2004 | Mar et al. | |
| 6,924,709 B2 | 8/2005 | Bashar | |
| 2001/0030554 A1 | 10/2001 | Ghezzi et al. | |
| 2002/0007467 A1 | 1/2002 | Ma et al. | |
| 2002/0108006 A1 | 8/2002 | Synder | |
| 2003/0001614 A1 | 1/2003 | Singh et al. | |
| 2003/0005402 A1 | 1/2003 | Bal | |
| 2003/0074637 A1 | 4/2003 | Pavesi et al. | |
| 2003/0210585 A1 | 11/2003 | Bernardi et al. | |
| 2003/0210599 A1 | 11/2003 | McClure | |
| 2003/0214321 A1 | 11/2003 | Swami et al. | |
| 2004/0008055 A1 | 1/2004 | Khanna et al. | |
| 2004/0036500 A1 | 2/2004 | Bratt | |

US 7,439,818 B2

VOLTAGE-AND TEMPERATURE-COMPENSATED RC OSCILLATOR CIRCUIT

CROSS-REFERENCE TO RELATED APPLICATIONS

This application is a continuation of co-pending U.S. patent application Ser. No. 11/022,331, filed Dec. 21, 2004.

BACKGROUND OF THE INVENTION

1. Field of the Invention

The present invention relates to integrated circuits. More particularly, the present invention relates to a voltage-compensated and temperature-compensated RC oscillator circuit for an integrated circuit.

2. Background

Integrated circuits have previously been provided with onboard oscillator circuits, including both RC oscillator circuits and crystal oscillator circuits. RC oscillator circuits are not known for frequency stability and are susceptible to both voltage-supply instability and temperature instability.

SUMMARY OF THE INVENTION

An integrated voltage-compensated and temperature-compensated RC oscillator is disclosed.

A better understanding of the features and advantages of the present invention will be obtained by reference to the following detailed description of the invention and accompanying drawings, which set forth an illustrative embodiment in which the principles of the invention are utilized.

DETAILED DESCRIPTION

Those of ordinary skill in the art will realize that the following description of the present invention is illustrative only and not in any way limiting. Other embodiments of the invention will readily suggest themselves to such skilled persons.

Figure 1:
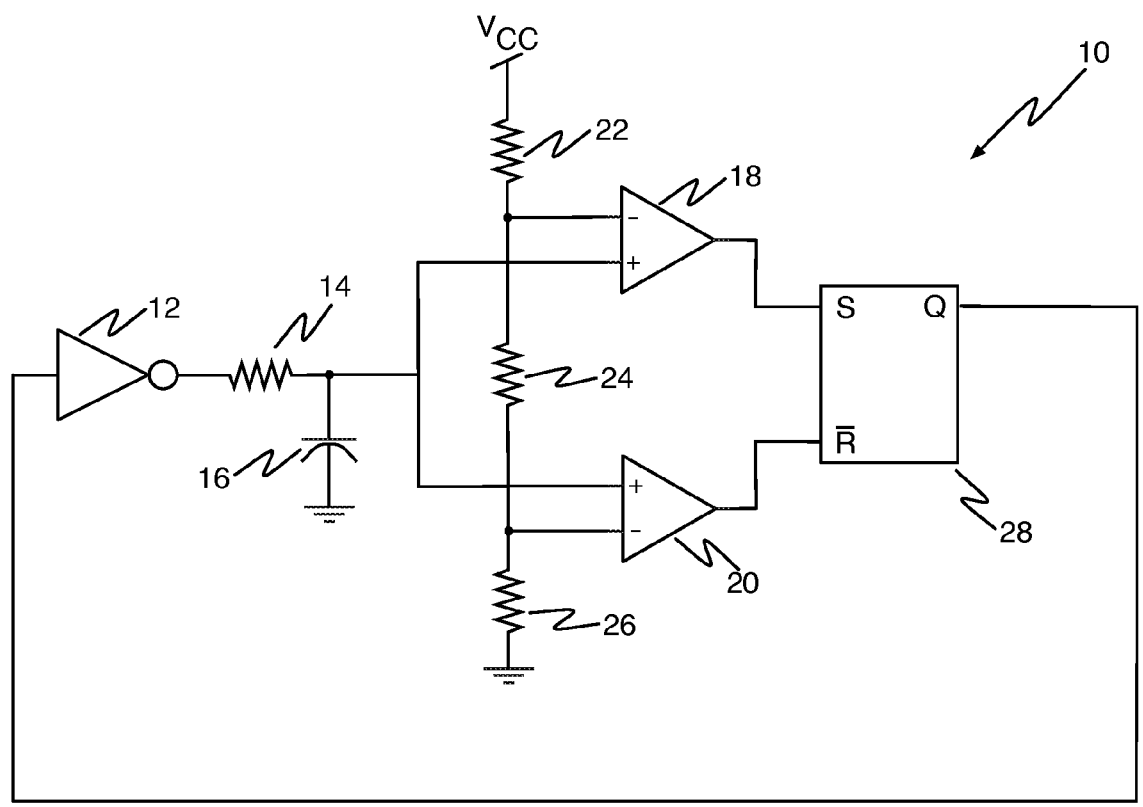
FIG. 1 is a schematic diagram of an illustrative integrated-circuit voltage-compensated and temperature-compensated RC oscillator circuit of the present invention.

Referring first to FIG. 1, a schematic diagram shows an illustrative integrated-circuit voltage-compensated and temperature-compensated RC oscillator circuit 10 according to the present invention. The output of inverter 12 drives an RC network including resistor 14 coupled between the output of inverter 12 and one plate of capacitor 16. The second plate of capacitor 16 is coupled to ground.

The node common to resistor 14 and capacitor 16 is coupled to the non-inverting input of a first analog comparator 18 and the non-inverting input of a second analog comparator 20. Both analog comparators 18 and 20 are temperature compensated according to the present invention as will be further disclosed herein.

The inverting input of the first analog comparator 18 and the inverting input of the second analog comparator 20 are coupled to a voltage divider network including resistors 22, 24, and 26 coupled in series between $V_{CC}$ and ground. Resistors 22, 24, and 26 are equal in value such that the trip point of first analog comparator 18 is always $\frac{2}{3} V_{CC}$ and the trip point of the second comparator 20 is always $\frac{1}{3} V_{CC}$. As will be appreciated by persons of ordinary skill in the art, these comparator trip points are independent of variations in $V_{CC}$ because the voltage division is fixed as a function of the fixed-value resistors 22, 24, and 26.

The output of first analog comparator 18 is coupled to the set input S of set-reset flip-flop 28. The output of second analog comparator 20 is coupled to the reset input R! of set-reset flip-flop 28. The Q output of set-reset flip-flop 28 is coupled to the input of inverter 12.

Figure 2:
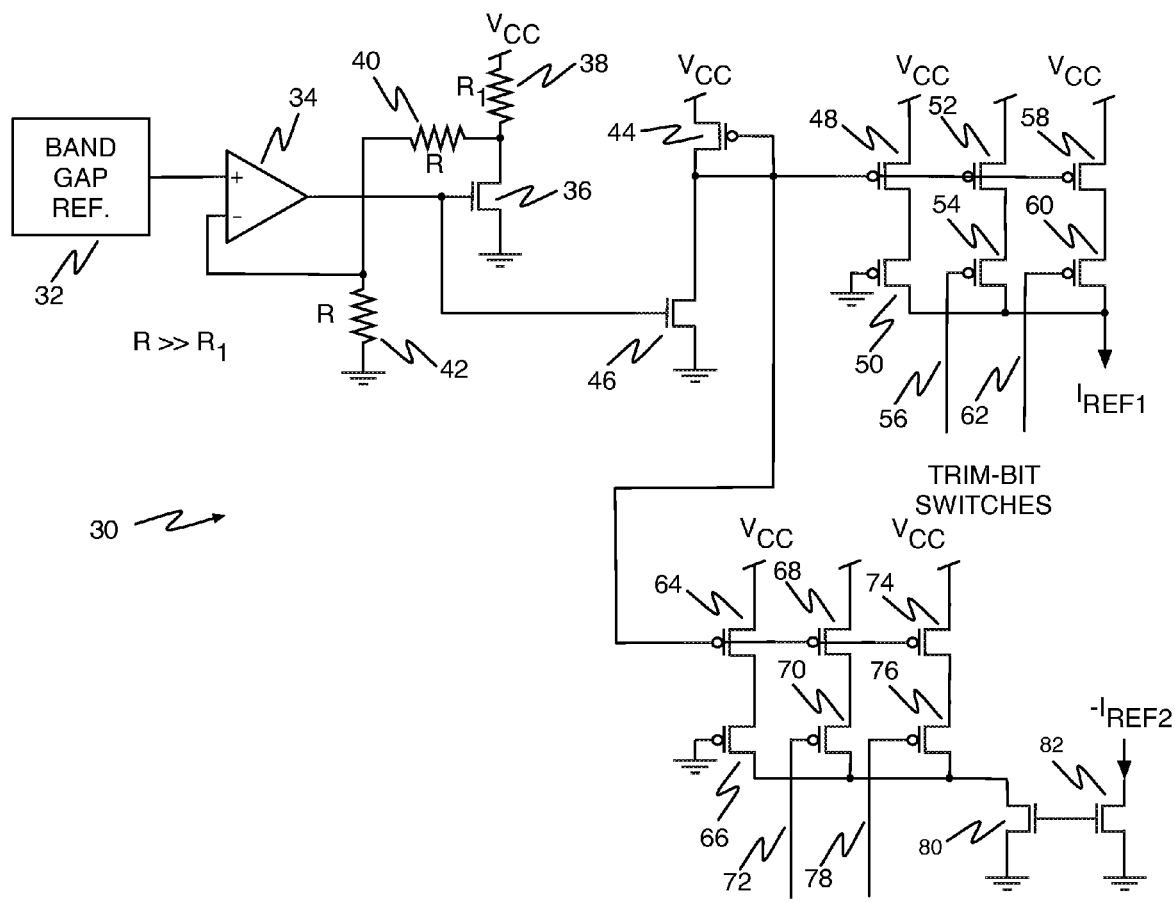
FIG. 2 is a schematic diagram of an illustrative voltage-compensation circuit that may be employed in the integrated-circuit voltage-compensated and temperature-compensated RC oscillator circuit of FIG. 1.

Referring now to FIG. 2, a schematic diagram shows an illustrative voltage-compensation circuit 30 that may be employed in the integrated-circuit voltage-compensated and temperature-compensated RC oscillator circuit of FIG. 1 in accordance with the present invention. Band-gap reference circuit 32 drives the inverting input of operational amplifier 34. The output of operational amplifier 34 drives the gate of n-channel MOS transistor 36. The source of n-channel MOS transistor 36 is grounded. Three resistors 38, 40 and 42 are connected as a series voltage divider between $V_{CC}$ and ground. Resistor 32 has a value that is much smaller than the values of resistors 40 and 42, whose values are equal. The drain of n-channel MOS transistor 36 is coupled to the common connection of resistors 38 and 40 and the non-inverting input of operational amplifier 34 is coupled to the common connection of resistors 40 and 42. This circuit provides a very stable voltage at the gate of n-channel MOS transistor 36.

Diode-connected p-channel MOS transistor 44 is coupled in series with n-channel MOS transistor 46 between $V_{CC}$ and ground. N-channel MOS transistor 46 has its gate coupled to the gate of n-channel MOS transistor 36. P-channel MOS transistor 48 is connected to p-channel MOS transistor 44 as a current mirror. P-channel MOS transistor 50 is turned on because its gate is coupled to ground and it generates the current $I_{REF1}$ at its source. P-channel MOS transistor 52 is also connected to p-channel MOS transistor 44 as a current mirror. If p-channel MOS transistor 54 is turned on using trim-bit switch line 56, it will contribute to the current $I_{REF}$ at its source, which is connected in common with the source of p-channel MOS transistor 50. P-channel MOS transistor 58 is also connected to p-channel MOS transistor 44 as a current mirror. If p-channel MOS transistor 60 is turned on using trim-bit switch line 62, it will contribute to the current $I_{REF1}$ at its source, which is connected in common with the source of p-channel MOS transistor 50. In the illustrative circuit of FIG. 2, the value of $I_{REF1}$ can be set to one of three values. Persons of ordinary skill in the art will appreciate that, if additional switched or unswitched p-channel and n-channel transistor pairs are provided, additional levels of $I_{REF1}$ current can be selectively generated to trim the value of $I_{REF1}$ at wafer sort.

P-channel MOS transistor 64 is connected to p-channel MOS transistor 44 as a current mirror. P-channel MOS transistor 66 is turned on because its gate is coupled to ground and it generates the current $I_{REF2}$ at its source. P-channel MOS transistor 68 is also connected to p-channel MOS transistor 44 as a current mirror. If p-channel MOS transistor 70 is turned on using trim-bit switch line 72, it will contribute to the current $I_{REF2}$ at its source, which is connected in common with the source of p-channel MOS transistor 66. N-channel MOS transistor 74 is also connected to p-channel MOS transistor 44 as a current mirror. If p-channel MOS transistor 76 is turned on using trim-bit switch line 78, it will contribute to the current $I_{REF2}$ at its source, which is connected in common with the source of p-channel MOS transistor 66. The sources of p-channel MOS transistors 66, 70, and 76 are coupled to the gate and drain of n-channel MOS transistor 80. N-channel MOS transistor 82 is coupled to n-channel MOS transistor 80 as a current mirror. As can be seen by persons of ordinary skill in the art, the current $-I_{REF2}$ is at the drain of n-channel MOS transistor 82. The current $-I_{REF2}$ is opposite in sign to the current $I_{REF1}$.

In the illustrative circuit of FIG. 2, the value of $-I_{REF2}$ can also be set to one of three values. Persons of ordinary skill in the art will appreciate that, if additional switched or unswitched p-channel and n-channel transistor pairs are provided, additional levels of $-I_{REF2}$ current can be selectively generated to trim the value of $-I_{REF2}$ at wafer sort.

Figure 3A:
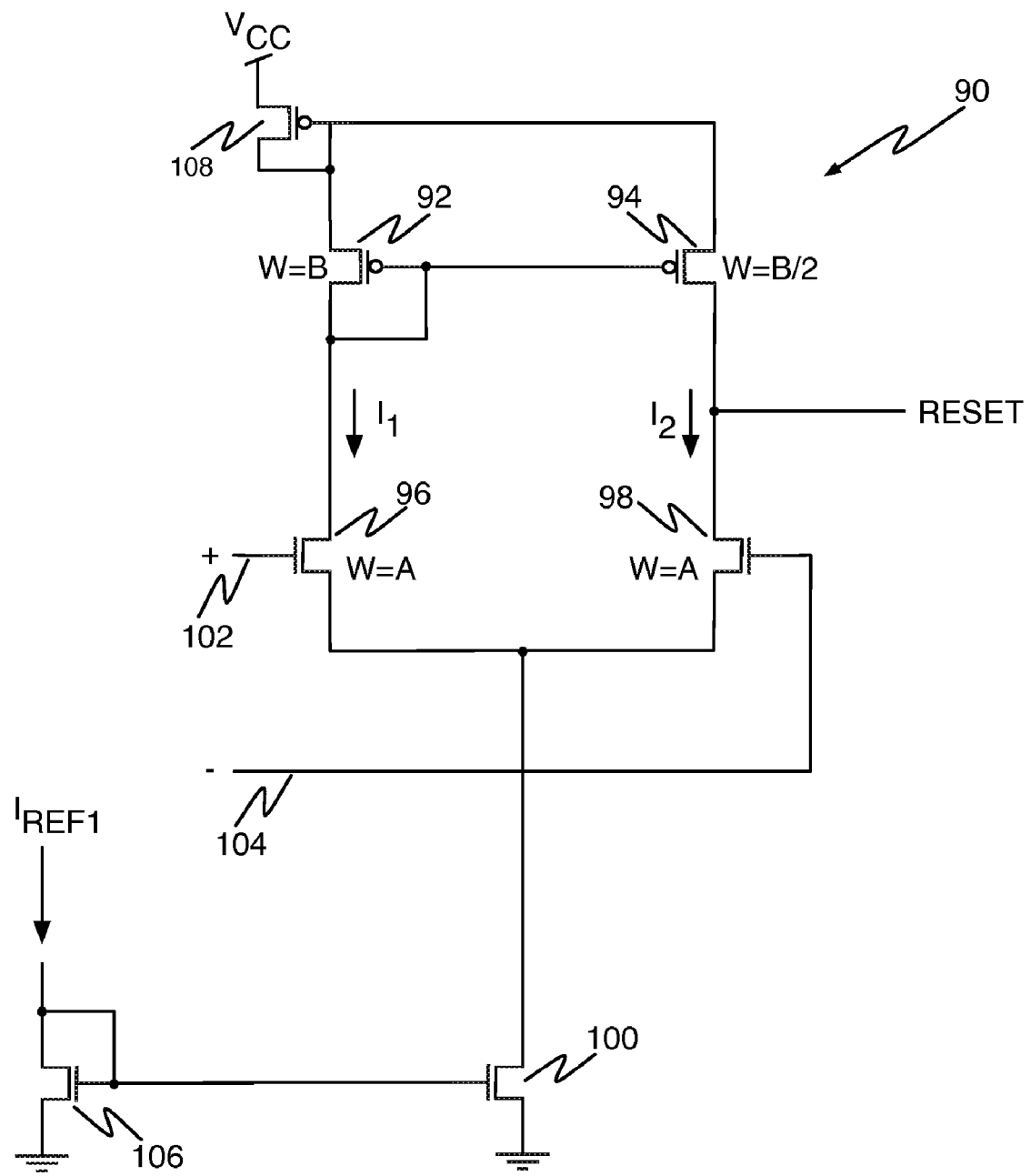
FIGS. 3A and 3B are schematic diagrams of illustrative temperature-compensation circuits that may be employed in the integrated-circuit voltage-compensated and temperature-compensated RC oscillator circuit of FIG. 1.

FIG. 3A is a schematic diagram of an illustrative temperature-compensated analog comparator circuit 90 that may be employed as analog comparator 20 in the integrated-circuit voltage-compensated and temperature-compensated RC oscillator circuit of FIG. 1. P-channel MOS transistors 92 and 94 and n-channel MOS transistors 96 and 98 are configured as a differential amplifier with bias transistor 100 coupled between the sources of n-channel MOS transistors 96 and 98 and ground. The gate of n-channel MOS transistor 96 serves as the non-inverting input 102 of the comparator and the gate of n-channel MOS transistor 98 serves as the inverting input 104 of the comparator. The output of the comparator is the common connection of the drains of p-channel MOS transistor 94 and n-channel MOS transistor 98. The gate of n-channel MOS bias transistor 100 is driven from diode-connected n-channel MOS transistor 106 and thus mirrors $I_{REF1}$. Diode-connected p-channel MOS transistor 108 may be optionally coupled between the sources of p-channel MOS transistors 92 and 94 and $V_{CC}$ in order to bias the sources of p-channel MOS transistors 92 and 94 at a $V_T$ below $V_{CC}$ as is known in the art.

As may be seen from an examination of FIG. 3A, the widths of n-channel MOS transistors 96 and 98 are the same and are equal to A. The width of p-channel MOS transistor 92 is equal to B and the width of p-channel MOS transistor 94 is equal to B/2. In an illustrative non-limiting embodiment of the invention A may be equal to 20 microns and B may be equal to 10 microns.

The analog comparator 90 of FIG. 3A is temperature compensated. As the temperature increases, the tendency of a differential amplifier circuit is to switch at a later point in time given the same voltage input conditions. By differently sizing the p-channel MOS transistors 92 and 94 such that p-channel MOS transistor 94 is smaller than p-channel MOS transistor 92 as shown in FIG. 3A, the trip point of the circuit tends to occur earlier in time than if both p-channel transistors had been sized the same, thus compensating for the temperature shift. As the ratio between the sizes of p-channel MOS transistors 92 and 94 increases, the amount of temperature compensation increases.

Figure 3B:
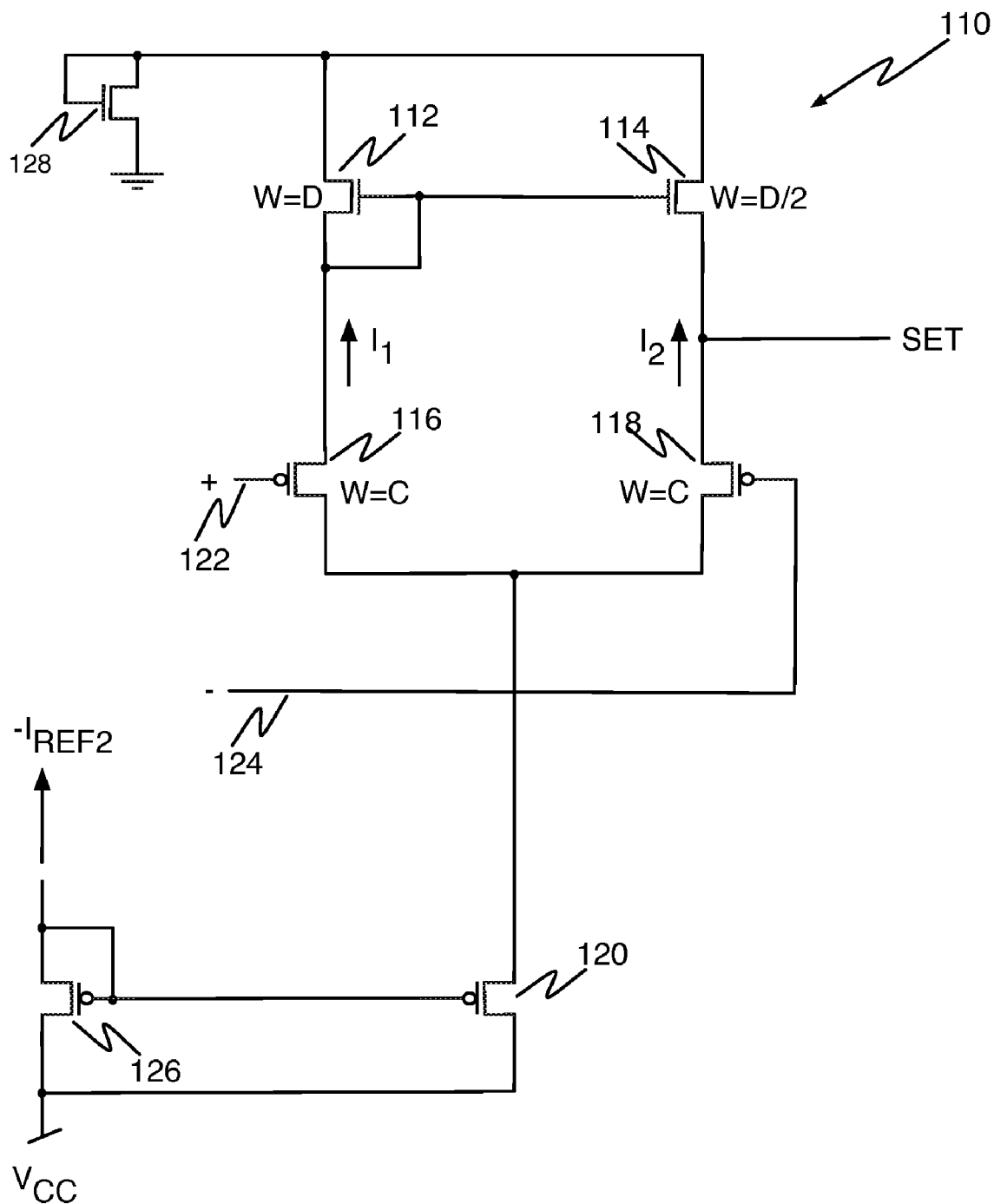

FIG. 3B is a schematic diagram of an illustrative temperature-compensated analog comparator circuit 110 that may be employed as analog comparator 18 in the integrated-circuit voltage-compensated and temperature-compensated RC oscillator circuit of FIG. 1. N-channel MOS transistors 112 and 114 and p-channel MOS transistors 116 and 118 are configured as a differential amplifier with bias transistor 120 coupled between the sources of p-channel MOS transistors 116 and 118 and $V_{CC}$. The gate of p-channel MOS transistor 116 serves as the inverting input 122 of the comparator and the gate of p-channel MOS transistor 118 serves as the non-inverting input 124 of the comparator. The output of the comparator is the common connection of the drains of n-channel MOS transistor 114 and p-channel MOS transistor 118. The gate of p-channel MOS bias transistor 120 is driven from diode-connected n-channel MOS transistor 126 and thus mirrors $I_{REF2}$. Diode-connected n-channel MOS transistor 128 may be optionally coupled between the sources of p-channel MOS transistors 112 and 114 and ground in order to bias the sources of n-channel MOS transistors 112 and 114 at a $V_T$ above ground as is known in the art.

As may be seen from an examination of FIG. 3B, the widths of p-channel MOS transistors 116 and 118 are the same and are equal to C. The width of n-channel MOS transistor 112 is equal to D and the width of n-channel MOS transistor 114 is equal to D/2. In an illustrative non-limiting embodiment of the invention C may be equal to 40 microns and D may be equal to 5 microns.

The analog comparator 90 of FIG. 3B is temperature compensated. As the temperature increases, the tendency of a differential amplifier circuit is to switch at a later point in time given the same voltage input conditions. By differently sizing the n-channel MOS transistors 112 and 114 such that n-channel MOS transistor 114 is smaller than n-channel MOS transistor 112 as shown in FIG. 3B, the trip point of the circuit tends to occur earlier in time than if both n-channel transistors had been sized the same, thus compensating for the temperature shift. As the ratio between the sizes of n-channel MOS transistors 112 and 114 increases, the amount of temperature compensation increases.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. An integrated temperature-compensated RC oscillator circuit including:
   an inverter having an input and an output;
   a resistor having a first terminal and a second terminal, the first terminal coupled to the output of the inverter;
   a capacitor coupled between the second terminal of the resistor and a fixed potential;
   a voltage divider network having a first node and a second node connected between a power-supply potential and ground;
   a first analog comparator having an inverting input coupled to the first node, a non-inverting input coupled to the second terminal of the resistor, and an output;
   a second analog comparator having a non-inverting input coupled to the second terminal of the resistor, an inverting input coupled to the second node, and an output;
   a set-reset flip-flop having a set input coupled to the output of the first analog comparator, a reset input coupled to the output of the second analog comparator, and an output coupled to the input of the inverter;
   the first and second analog comparators each comprising a differential amplifier each having a diode-connected current mirror MOS transistor in series with a non-inverting-input MOS transistor and a mirrored MOS transistor in series with an inverting-input transistor, the diode-connected current mirror MOS transistor having a width larger than the width of the mirrored MOS transistor, the differential amplifier further having a MOS bias transistor having a drain coupled to the sources of the inverting-input and non-inverting-input input transistors, a source coupled to ground, and a gate coupled to a bias-voltage supply.

2. The integrated temperature-compensated RC oscillator circuit of claim 1, wherein the voltage divider network further comprises a first resistor, a second resistor and a third resistor coupled in series between the power-supply potential and ground.

3. The integrated temperature-compensated RC oscillator circuit of claim 2, wherein:
   the first resistor is connected between the power-supply potential and the first node;
   the second resistor is connected between the first node and the second node; and
   the third resistor is connected between the second node and ground.

4. The integrated temperature-compensated RC oscillator circuit of claim 1, wherein the inverting-input and non-inverting-input input transistors of the first and second analog comparators have equal channel widths.

5. The integrated temperature-compensated RC oscillator circuit of claim 1, wherein the bias-voltage supply is derived from a band-gap reference-voltage circuit.

6. The integrated temperature-compensated RC oscillator circuit of claim 1, wherein the width of the diode-connected transistor in the first and second analog comparators is about twice the width of the mirrored MOS transistor.

7. The integrated temperature-compensated RC oscillator circuit of claim 1, wherein the sources of the diode-connected current minor MOS transistor and the mirrored MOS transistor have a source bias of $V_T$.

8. The integrated temperature-compensated RC oscillator circuit of claim 1, wherein the sources of the current mirror MOS transistor and the mirrored MOS transistor are coupled to source potential through a diode-connected MOS transistor.

9. The integrated temperature-compensated RC oscillator circuit of claim 1, wherein:
   the current mirror MOS transistor and the mirrored MOS transistor in the first comparator and the inverting-input MOS transistor, the non-inverting-input transistor, and the bias transistor in the second comparator are of a first conductivity type; and
   the current mirror MOS transistor and the mirrored MOS transistor in the second comparator and the inverting-input MOS transistor, the non-inverting-input transistor and the bias transistor in the first comparator are of a second conductivity type opposite the first conductivity type.

* * * * *